United States Patent
Zwanger

(10) Patent No.: US 7,633,291 B2
(45) Date of Patent: Dec. 15, 2009

(54) MAGNETIC RESONANCE SYSTEM AND METHOD FOR DETERMINING A DIFFUSION-WEIGHTED IMAGE

(75) Inventor: Michael Zwanger, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 577 days.

(21) Appl. No.: 11/594,635

(22) Filed: Nov. 8, 2006

(65) Prior Publication Data

US 2007/0167732 A1 Jul. 19, 2007

(30) Foreign Application Priority Data

Nov. 8, 2005 (DE) ........................ 10 2005 053 269

(51) Int. Cl.
*G01V 3/00* (2006.01)
(52) U.S. Cl. ........................ 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 5,560,360 A * | 10/1996 | Filler et al. | 600/408 |
| 6,265,872 B1 | 7/2001 | Heid | |
| 6,614,225 B1 * | 9/2003 | Feinberg | 324/307 |
| 6,842,000 B2 | 1/2005 | Norris et al. | |
| 6,891,373 B2 * | 5/2005 | Deimling | 324/309 |
| 7,078,897 B2 * | 7/2006 | Yablonskiy et al. | 324/307 |
| 7,170,289 B2 * | 1/2007 | Kumai et al. | 324/309 |
| 2004/0189297 A1 | 9/2004 | Bock et al. | |
| 2007/0249931 A1 * | 10/2007 | Fain et al. | 600/420 |

OTHER PUBLICATIONS

"Reduction of Eddy-Current-Induced Distortion in Diffusion MRI Using a Twice-Refocused Spin Echo," Reese et al., Magnetic Resonance in Medicine, vol. 49, (2003) pp. 177-182.
"Simultaneous T2-and T2*-Weighted MRI Using a New Form of Stimulated Echo," Ordidge et al., ISMRM 1995, p. 870.
Eddy Current-Nulled Diffusion Weighting, Heid, Proc. Int'l Soc. Mag. Reson. Med., vol. 8 (2000), p. 799.

* cited by examiner

*Primary Examiner*—Brij B Shrivastav
(74) *Attorney, Agent, or Firm*—Schiff Hardin LLP

(57) ABSTRACT

In a method for determination of a diffusion-weighted image of an examination subject in a magnetic resonance system, a diffusion-weighted data set is acquired with magnetic diffusion gradients being activated; a diffusion-weighted image of the examination subject is calculated using this diffusion-weighted data set; dephasing or spoiler gradients are activated in order to reduce artifacts in the diffusion-weighted image due to additional signal echoes and the position and/or amplitude and/or polarity of the dephasing gradients is/are selected dependent on the diffusion gradients.

15 Claims, 3 Drawing Sheets

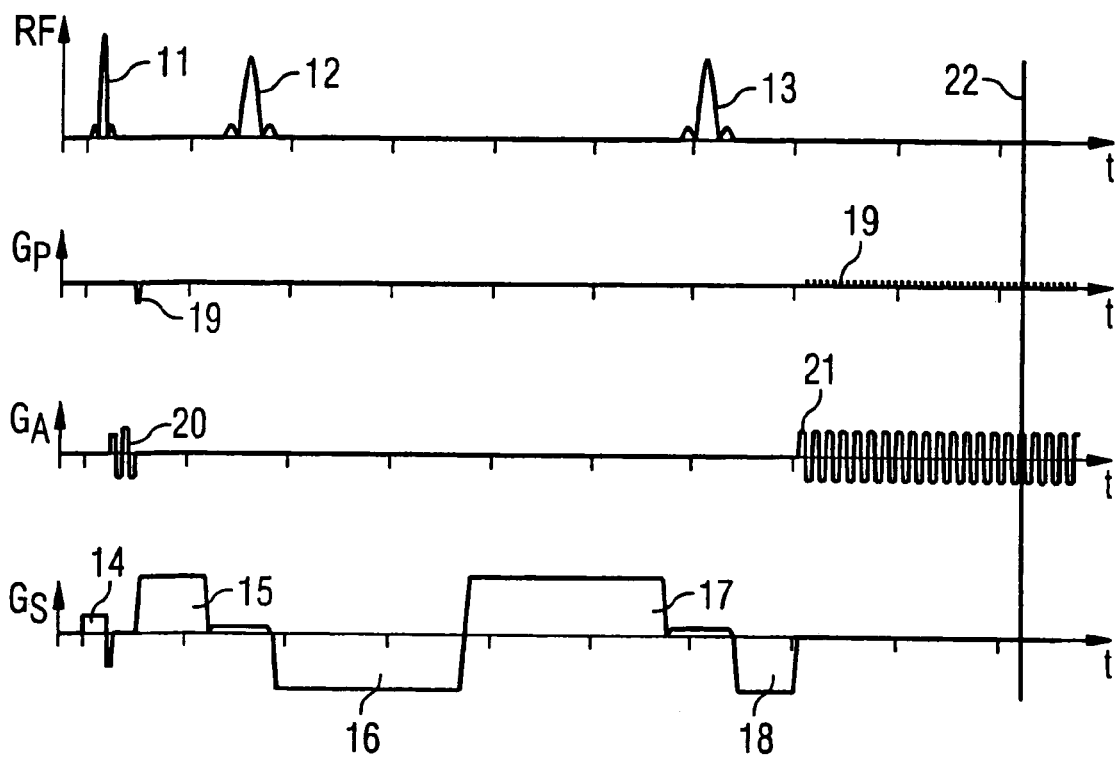
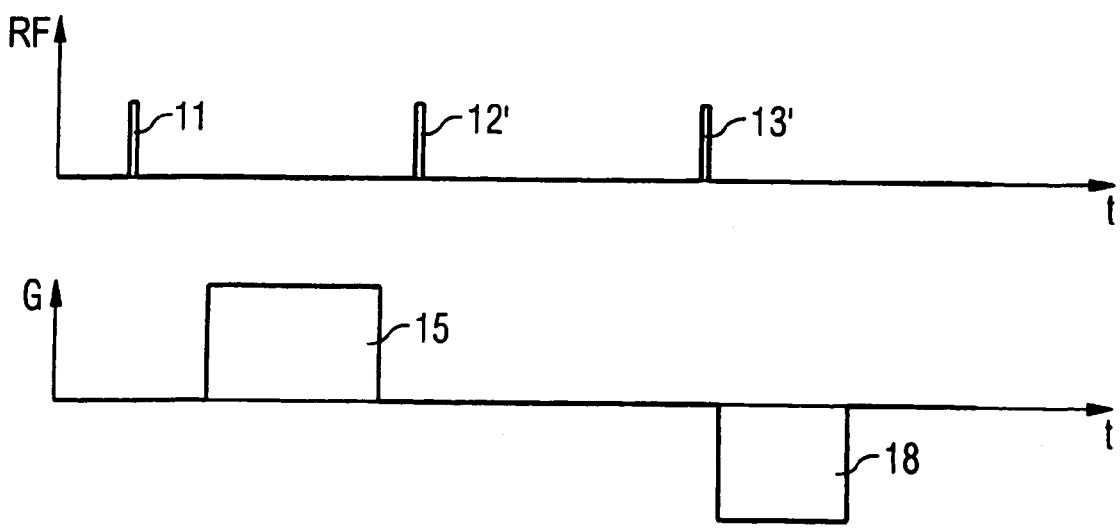

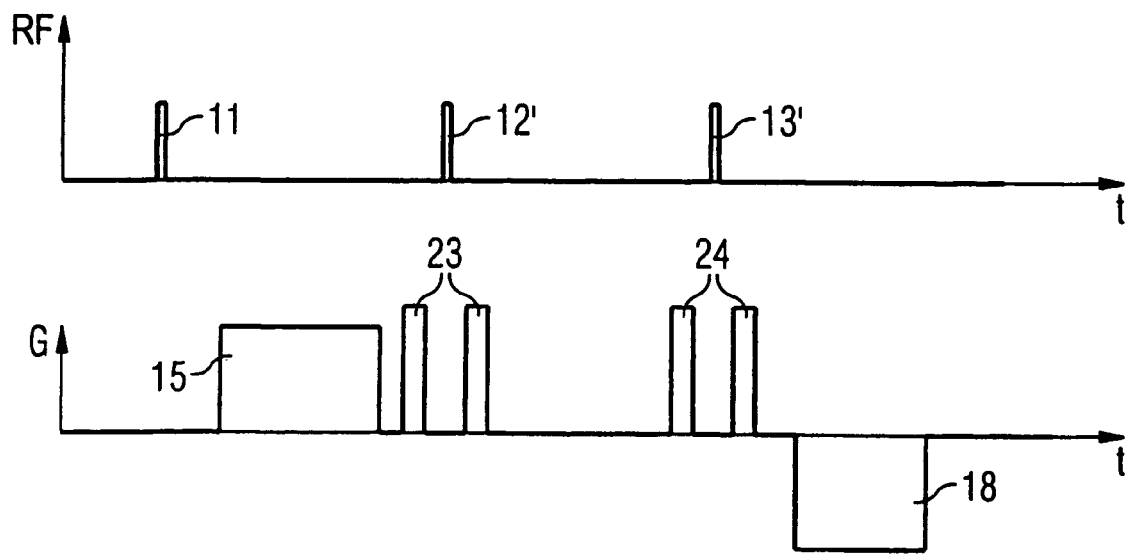
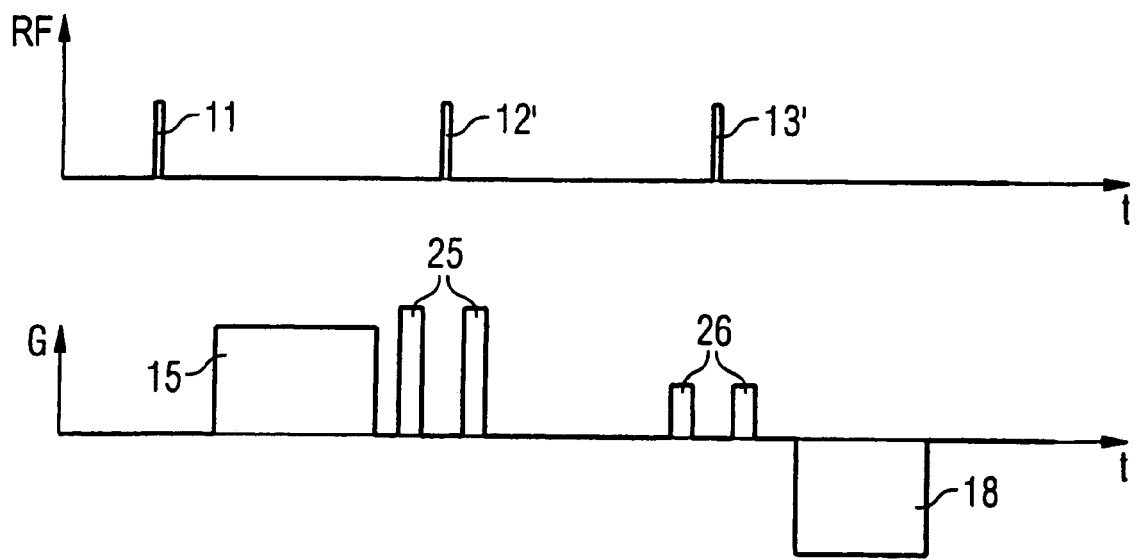

FIG 5
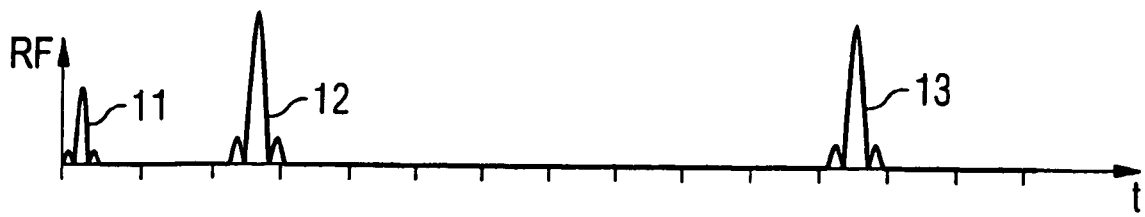
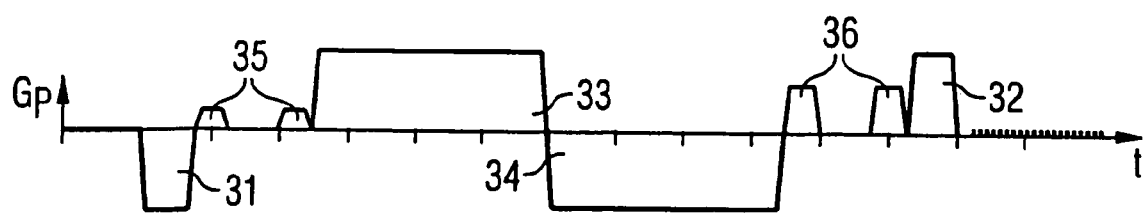
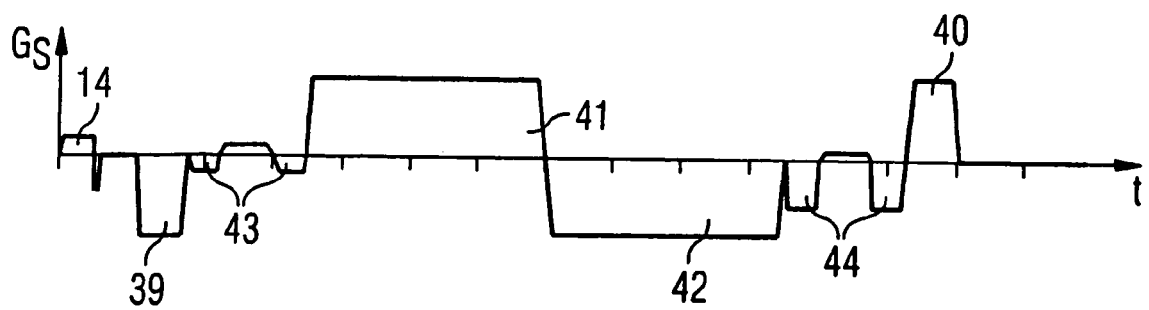

MAGNETIC RESONANCE SYSTEM AND METHOD FOR DETERMINING A DIFFUSION-WEIGHTED IMAGE

BACKGROUND OF THE INVENTION

1. Field of the Invention

The present invention concerns a method for determination of a diffusion-weighted image of an examination subject in a magnetic resonance system and a magnetic resonance system for this purpose. The invention in particular concerns a method and system of the type wherein the diffusion-weighted images are acquired using a double spin echo imaging sequence.

2. Description of the Prior Art

In magnetic resonance tomography imaging methods have been established with which the diffusion of the water molecules in the human body can be made visible. With the aid of diffusion imaging, magnetic resonance tomography in particular supplies valuable insights in the assessment of patho-physiological events and processes, for example in the human brain. It is in particular possible to localize stroke areas in the brain.

The difference arises due to the thermal translation movement of molecules. This is a random process that is also known as Brownian molecular motion. The distances covered by the diffused molecules on which the diffusion-weighted magnetic resonance tomography is based are very small. Strong magnetic field gradients (known as diffusion gradients) are used for diffusion-weighted imaging. These strong magnetic field gradients are used in addition to the gradient fields in the imaging sequence that are necessary for spatial coding. For diffusion imaging the physical effect is utilized that the magnetic resonance signal decreases given a difference movement of the molecules under the influence of magnetic field gradients. The phase of the magnetic resonance signal changes in proportion to the applied magnetic field gradients. If a bipolar diffusion magnetic field gradient is now activated, the phase development for resting (non-moving) spins now cancels out due to the bipolar gradient; for spins moving due to diffusion the moving spin experiences a different magnetic field. In the case of a bipolar diffusion gradient, for diffusing spins the signals at the end of both diffusion gradients are no longer phase coherent (as for resting spins) but rather are distributed. This entails a signal decrease. If a non-diffusion-weighted data set and a diffusion-weighted data set (given which additional diffusion gradients are activated) are now acquired, a conclusion about the diffusion can be reached from the difference of the two data sets.

The diffusion is typically a diffusion tensor that depends on the spatial direction. This diffusion tensor is a symmetrical tensor with six coefficients. To determine the diffusion tensor, non-diffusion-weighted data sets and at least six (for example 20-60) diffusion-weighted data sets are acquired in order to calculate the diffusion tensor.

Diffusion-weighted imaging techniques are very sensitive to gradient-induced eddy current effects. To avoid eddy current effects it was, for example, proposed in the conference volume of the Society of Magnetic Resonance in Medicine, page 799 in the year 2000, to use a double spin echo sequence with four diffusion gradients, i.e. two diffusion gradient pairs.

Furthermore, in such double spin echo sequences gradients known as spoilers or dephasing gradient fields are applied in order to avoid unwanted ancillary echoes. In spite of this, stripe artifacts in the magnetic resonance image have occurred under specific circumstances with such diffusion-weighted imaging sequences.

SUMMARY OF THE INVENTION

An object of the present invention is to generate diffusion-weighted magnetic resonance images with which such stripe artifacts can be reliably suppressed.

The above object is achieved in accordance with the invention by a method for determination of a diffusion-weighted image wherein: a diffusion-weighted data set is acquired, using diffusion gradients. Diffusion-weighted images of the examination subject can then be calculated on the basis of the diffusion-weighted data set. Dephasing or spoiler gradients are additionally activated in order to reduce artifacts in the diffusion-weighted image due to additional signal echoes. According to the present invention, the position and/or the amplitude and/or the polarity of the dephasing gradients is/are selected dependent on the diffusion gradients. In the prior art, constant and symmetrical dephasing gradients were used in the imaging sequence in order to reduce artifacts in the image. These constant, pre-programmed dephasing or spoiler gradients, however, could not reliably prevent the appearance of artifacts in the image. The invention is now based on the insight that the artifacts can be prevented in a reliable manner when the position and/or the amplitude and/or the polarity of the dephasing gradients is/are adapted to the current diffusion gradients. The diffusion-weighted image can also include the representation of the diffusion tensor.

According to a preferred embodiment of the invention, in the workflow of the imaging sequence, the amplitude and/or position and/or polarity of the dephasing gradients for each imaging sequence is/are selected dependent on the current imaging sequence workflow and/or the direction of the applied diffusion gradients. The dephasing gradients were previously programmed into the sequence workflow in a fixed manner. According to the invention, the dephasing gradients are calculated dependent on the direction of the applied diffusion gradients and are inserted into the sequence workflow in the planning of the sequence workflow, when this is set, or even at run time.

Furthermore, a diffusion-weighted data set and a non-diffusion-weighted data set can be acquired or data sets with different diffusion weightings can be acquired, and diffusion-weighted images can be generated on the basis of the different diffusion weightings of the acquired data sets.

For example, an imaging sequence with doubled spin echo can be used for acquisition of the diffusion-weighted data set and the non-diffusion-weighted data set. Such an imaging sequence has a 90° radio-frequency pulse and two 180° radio-frequency pulses. These imaging sequences (known as double spin echo sequences) can be used for diffusion weighting. With these double spin echo sequences with two 180° radio-frequency pulses, according to the invention one dephasing gradient can be activated just before each 180° pulse and one dephasing gradient can be activated just after each 180° pulse. The amplitude and the polarity of these dephasing gradients depend on the selection and the parameters of the diffusion gradients.

In a preferred embodiment of the invention, the amplitude and/or polarity and/or duration and/or position of the diffusion gradients is/are determined. The amplitude and the polarity of the dephasing gradients can then be calculated from the specific values. As noted above, the diffusion constant is a tensor with components in the various spatial directions. For calculation of the tensor different diffusion-weighted data sets are acquired, with diffusion gradients with different intensities in the different three spatial directions being used. The position and the presence of the diffusion gradients are different for the various imaging sequences.

The gradient moments of the diffusion gradients, meaning the product of the gradient amplitude and the activation duration (more precisely the surface integral under the activated gradient on the time axis), are preferably determined.

In a preferred embodiment, the gradient moment of the dephasing gradients that are activated before and after the first 180° pulse differs in magnitude from the gradient moment of the dephasing gradients that are switched before and after the second 180° pulse. This has the following cause.

Four diffusion gradients with alternating polarity, i.e. two bipolar diffusion gradient pairs for one spatial direction, are advantageously used in the diffusion-weighted double spin echo sequence. A first diffusion gradient pair encloses the second diffusion gradient pair. This means that the first diffusion gradient pair is the first gradient and the fourth gradient that enclose the second diffusion gradient pair (the second and the third diffusion gradients) in the temporal sequence. The total gradient moment of the first diffusion gradient pair is now different. This means that the area under the first diffusion gradient differs from the area under the fourth diffusion gradient. This difference in the gradient moments corresponds to a net gradient moment that acts like an additional dephasing or spoiler gradient. The dephasing gradients placed between the two 180° pulses must now be selected such that this net gradient moment is amplified and is not canceled.

The difference of the gradient moments of the first diffusion gradient pair determines the polarity of the dephasing gradients around the 180° pulses.

According to a further aspect of the invention, the dephasing gradients are activated with the larger gradient moment around the 180° pulse that lies closer to the diffusion gradient of the diffusion gradient pair that has a larger gradient moment than the other diffusion gradient of the first diffusion gradient pair. It is thus ensured that the aforementioned net moment of the diffusion gradients is amplified and not canceled. This amplification is necessary so that the artifacts occurring in the image can be avoided. As is explained below in the exemplary embodiments, the formation of additional unwanted echoes that would lead to unwanted artifacts in the images thus can be effectively prevented.

Furthermore, the gradient moment of the readout gradient is determined. Given the selection of the dephasing gradients that are activated around the 180° pulses, according to a preferred embodiment of the invention the gradient moment of these dephasing gradients is at least as large as the gradient moment of the signal readout gradients. The amplitudes of the dephasing gradients can be selected dependent on the gradient moment of the signal readout gradient. The gradient moment of the dephasing gradient is preferably between 1.3-1.7 times as large as the gradient moment of the readout gradient. Furthermore, the gradient moment of the dephasing gradients is preferably 1.5 times as large as the gradient moment of the signal readout gradients.

For example, for acquisition of the diffusion-weighted data sets and non-diffusion-weighted data sets, the echoplanar technique can be used in order to reduce the acquisition time of the diffusion-weighted images. Naturally other suitable imaging sequence can also be used.

DESCRIPTION OF THE DRAWINGS

FIG. 1 shows an example of a pulse sequence of a diffusion-weighted double spin echo sequence according to the prior art.

FIG. 2 shows an exemplary sequence of the radio-frequency pulses and gradients for explanation of the physical background of the invention.

FIG. 3 shows the sequence of FIG. 2 with additional dephasing gradients according to the prior art.

FIG. 4 shows the sequence of FIG. 2 with the inventive insertion of dephasing gradients.

FIG. 5 shows a sequence with activation of the dephasing gradients according to the present invention.

DESCRIPTION OF THE PREFERRED EMBODIMENTS

An example of a pulse sequence of a double spin echoplanar sequence without switching of diffusion gradients according to the prior art is shown in FIG. 1. In this double spin echo imaging sequence a 90° radio-frequency pulse 11 is radiated into the examination subject (not shown), followed by two 180° pulses 12 and 13. A magnetic field gradient GS for slice selection is switched (gradient 14) at the same time as the 90° pulse. The switching of the addition diffusion gradients 15-18 ensues in the slice direction after the slice-selection gradient in the slice direction.

Furthermore, a phase coding gradient $G_p$ is activated in the phase coding direction. This gradient 19 corresponds to the phase coding gradient of an echoplanar imaging sequence. A readout gradient $G_A$ is likewise activated in the signal readout direction (gradients 20 and 21), whereby the signal readout ensues during the switching of the gradient 21. A central spin echo 22 (that is read out during the signal readout upon switching of the gradient 21) ensues via the switching of the 90° pulse and both 180° pulses 12 and 13. In the sequence order shown in FIG. 1, no additional spoiler or dephasing gradients ensue in order to avoid unwanted echoes.

In connection with FIG. 2 it is explained in detail how these unwanted echoes arise in order to understand the basis for avoiding unwanted echoes. In principle, three different types of echoes are to be differentiated, namely the spin echo that occurs given the activation from a 90° pulse and 180° pulse that was discovered by Hahn, as well as stimulated and anti-stimulated echoes that additionally occur. The anti-stimulated echoes have been described by Ordige in the conference volume of the Society of Magnetic Resonance in Medicine, 1995, page 670. The 180° pulses 12 and 13 from FIG. 1 and FIG. 2 are considered as 90° pulses 12' and 13' for understanding of the stimulated and anti-stimulated echoes. This is based on the fact that no radio-frequency pulse is so ideal that 90° signal portions do not also occur given a 180° pulse. Furthermore, the first diffusion pulse 15 and the fourth diffusion pulse 18 of the diffusion-weighted gradient switching are shown. After the first 90° pulse 11 the spins are tilted in the transversal plane and there experience the magnetic field gradient 15. They are tilted in the vertical plane by the second 90° pulse 12', such that here no transversal component exists. For this reason both gradient switchings 16 and 17 can be disregarded, or do not have to be taken into account. After the third 90° pulse 13', the spins are tilted again in the transversal plane where they are subjected to the diffusion gradient 18. The diffusion gradients 15 and 18 form the first bipolar diffusion gradient pair that surrounds the second bipolar diffusion gradient pair 16 and 17 from FIG. 1.

As can be seen in FIG. 2, the gradient moment (i.e. the area under the switched gradient) is larger for the gradient 15 than for the gradient 18. This net gradient moment is provided in order to avoid unwanted echoes and in order to prevent distortions due to eddy currents. The gradient moments of the gradients 15 and 18, however, do not necessarily differ strongly, such that an anti-stimulated echo is not reliably avoided. When both moments are identical, meaning that their sums cancel out, it leads to an anti-stimulated echo in the k-space center. When these two moments are not identical or do not strongly differ, this echo of the signal acquisition in k-space or Fourier space is displaced from the center, which can then lead to the unwanted stripe artifacts in the image.

In FIG. 3 it is shown how these echoes were previously avoided in the prior art. In addition to the diffusion gradients 15 and 16, two dephasing or spoiler gradients 23 and 14 activated around the pulses 12' and 13'. The gradient pair is switched around the pulse 12', the gradient pair 24 around the radio-frequency pulse 13'. As can be seen in FIG. 3, according to the prior art symmetrical gradients with the same amplitude were used. These symmetrical gradients, however, could not reliably prevent the occurrence of the anti-stimulated echoes and therewith the stripe artifacts in the image. The spoiler gradients 23 and 24 must be activated around the 180° pulses in order to obtain the spin echo. Furthermore, these dephasing gradients must be activated as briefly as possible in order to be able to minimize the echo time.

FIG. 4 shows how the inventive embodiment of the dephasing gradients must ensue in order to reliably avoid the occurrence of stripe artifacts in the image. As is explained in connection with FIG. 2, the gradient moment of the diffusion gradients 15 and 18 are different. In the shown example the gradient moment of the gradient 15 is greater than that of the gradient 18. Furthermore, the spoiler gradients 25 and 26 are shown in FIG. 4. These spoiler gradients 25, 26 inventively have a different gradient moment, which was not the case given the gradient moment of the gradients 23 and 24. Since the switching time for the spoiler gradients 25, 26 should be as short as possible and is therewith equal, the amplitudes of the spoiler gradients 25 and 26 are different. The amplitude of the spoiler gradients 25 and 26 is selected such that the difference of the gradient moments from the gradient moments 25 and 26 is at least as large as the gradient moment of the readout gradient. The difference of the gradient moments of the gradient 25 and 26 is advantageously 1.5 times as large as the gradient moment of the readout gradient.

In order to amplify the net gradient moment of both diffusion gradients 15 and 18, the position of the two spoiler gradients 25 with the larger amplitude is selected such that they lie closer to the diffusion gradient that has a larger gradient moment. The net difference can thereby be amplified in the gradient moment between the diffusion gradients 15 and 18.

In the prior art the spoiler gradients 23 and 24 from FIG. 3 were kept constant. However, the diffusion gradients differ in terms of their amplitude and polarity given generation of the various diffusion-weighted data sets in order to be able to calculate the diffusion tensor overall. For this reason the switching shown in FIG. 3 is not able to effectively avoid stimulated or, respectively, anti-stimulated echoes. The polarity and the amplitude of the spoiler gradients now inventively depend on the diffusion gradients. Since the diffusion gradients are not the same for all diffusion-weighted data sets, the polarity must be calculated given each acquisition of a data set in the progression of the imaging sequence. During progression of the imaging sequence, the net gradient moment must be calculated from the first diffusion gradient 15 and the fourth diffusion gradient 18. The polarity of the spoiler gradients 25 and 26 must be selected dependent on which moment is greater. Among other things, the amplitude of the spoiler gradients 25 and 26 depends on the gradient moment of the readout gradient.

An inventive imaging sequence for generation of diffusion-weighted images is shown in FIG. 5. In the shown embodiment diffusion gradients are activated in the phase coding direction and in the slice-selection direction. As in the exemplary embodiment from FIG. 1, this is a double spin echo sequence with a 90° pulse 11 and two 180° pulses 12 and 13. A first diffusion gradient pair 31 and 32 that temporally surrounds the second diffusion gradient pair with the gradients 33 and 34 is switched in the phase coding direction. Dephasing gradients 35 are additionally activated around the first 180° pulse 12 and dephasing gradients 36 are activated around the second 180° pulse 13. As can be seen in FIG. 5, the amplitudes of these two dephasing gradients 35 and 36 differ. This likewise applies for the two dephasing gradients 37 and 38 that are activated in the readout direction. During the 90° pulse 11 the gradient 14 is activated in the slice-selection direction before the first gradient 39 of the diffusion gradient pair (namely the gradients 39 and 40) is activated. Two further diffusion gradients 41 and 42 are likewise switched in the slice-selection direction between the two 180° pulses 12 and 13. The dephasing gradients 43 and 44 differ in turn in terms of their amplitude in the slice-selection direction.

As is to be learned in FIG. 5, the gradient moment of the gradient 32 was selected larger than the gradient moment of the gradient 31, such that the gradient moment of the dephasing gradients 36 was selected larger than the gradient moment of the dephasing gradients 35. This likewise applies for the slice-selection gradient, given which the gradient moment of the gradient 40 is greater than the gradient moment of the diffusion gradient 39. For amplification of the net moment the amplitude of the dephasing gradients 43 and 44 was correspondingly selected in order to amplify the net moment.

In summary, the adaptation of the amplitude and the polarity of the dephasing gradients to the current imaging sequence enable the avoidance of unwanted artifacts in a diffusion-weighted image.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a diffusion-weighted magnetic resonance image of an examination subject, comprising the steps of:

exposing an examination subject in a magnetic resonance system to a pulse sequence, including activating magnetic diffusion gradients and activating artifact-reducing gradients selected from the group consisting of dephasing gradients and spoiler gradients, to acquire a diffusion-weighted magnetic resonance data set from the examination subject;

calculating a diffusion-weighted image of the examination subject from the diffusion weighted magnetic resonance data set; and setting at least one characteristic selected from the group consisting of a position of said artifact-reducing gradients, an amplitude of said artifact-reducing gradients, and a polarity of said artifact-reducing gradients, dependent on said magnetic diffusion gradients to reduce artifacts in said diffusion-weighted image due to additional signal echoes produced by said artifact-reducing reducing gradients.

2. A method as claimed in claim 1 comprising additionally acquiring a non-diffusion-weighted data set from the examination subject, and electronically calculating said diffusion-weighted image of the examination subject from said diffusion weighted data set and said non-diffusion-weighted data set.

3. A method as claimed in claim 2 comprising acquiring said diffusion-weighted data set and said non-diffusion-weighted data set with a doubled spin echo sequence, including irradiation a 90° radio frequency pulse and two 180° radio frequency pulses.

4. A method as claimed in claim 3 comprising activating two of said artifact-reducing gradients respectively before and after each of said 180° radio frequency pulses.

5. A method as claimed in claim 2 comprising acquiring said diffusion-weighted data set and said non-diffusion weighted data set with an echo planar pulse sequence.

6. A method as claimed in claim 1 comprising using said amplitude and said polarity of said artifact-reducing gradients as said characteristic, and comprising determining at least one characteristic of said diffusion gradients selected from the group consisting of an amplitude of said diffusion gradients, a polarity of said diffusion gradients, a duration of said diffusion gradients, and a position of said diffusion gradients, and setting said amplitude and polarity of said artifact-reducing gradients dependent on said at least one diffusion gradient characteristic.

7. A method as claimed in claim 1 comprising, in said pulse sequence, activating a readout gradient and reading out said diffusion-weighted magnetic resonance data set during said readout gradient, and comprising activating said artifact-reducing gradients with a gradient moment at least as large as a gradient moment of said signal readout gradient.

8. A method as claimed in claim 7 comprising activating said artifact-reducing gradients with a gradient moment that is at least 1.5 times as large as said gradient moment of said readout gradient.

9. A method as claimed in claim 7 comprising determining the gradient moment of the readout gradient, and setting amplitudes of said artifact-reducing gradient dependent on said gradient moment of said readout gradient.

10. A method as claimed in claim 2 comprising acquiring said diffusion-weighted data set and said non-diffusion-weighted data set with a doubled spin echo sequence, including irradiation a 90° radio frequency pulse and two 180° radio frequency pulses and comprising activating first ones of said artifact-reducing gradients respectively before and after a first of said 180° pulses, and activating second ones of said artifact-reducing gradients respectively before and after a second of said 180° pulses, with said first ones of said artifact-reducing gradients having a gradient moment that differs from said second ones of said artifact-reducing gradients.

11. A method as claimed in claim 10 comprising acquiring said diffusion-weighted magnetic resonance data set along multiple, different spatial directions, and wherein the step of activating said magnetic diffusion gradients comprises, in one of said spatial directions, activating a first diffusion gradient pair and a second diffusion gradient pair, with said first diffusion gradient pair enclosing said second diffusion gradient pair, and activating said first diffusion gradient pair with the respective diffusion gradients therein having respective gradient moments that differ in terms of magnitude.

12. A method as claimed in claim 11 comprising determining a polarity of said first ones of said artifact-reducing gradients and said second ones of said artifact-reducing gradients dependent on a difference between the respective gradient moments of the diffusion gradients in said first diffusion gradient pair.

13. A method as claimed in claim 11 comprising activating, around a respective 180° pulses, artifact-reducing gradients with a larger gradient moment that are closer to the diffusion gradient of the first diffusion gradient pair that has a larger gradient moment than the other diffusion gradient of said first diffusion gradient pair.

14. A method as claimed in claim 1 comprising setting said at least one characteristic of said artifact-reducing gradients in a current execution of said pulse sequence dependent on at least one of a workflow of said current pulse sequence and a direction of the activated diffusion gradients.

15. A magnetic resonance system comprising:
   a magnetic resonance scanner configured to interact with an examination subject;
   a control unit connected to said magnetic resonance scanner to operate said magnetic resonance scanner to expose said examination subject to a pulse sequence, by activating magnetic diffusion gradients and activating artifact-reducing gradients selected from the group consisting of dephasing gradients and spoiler gradients, to acquire a diffusion-weighted magnetic resonance data set from the examination subject;
   an image computer supplied with said diffusion-weighted magnetic resonance data set that calculates a diffusion-weighted image of the examination subject from the diffusion weighted magnetic resonance data set; and
   said control unit setting at least one characteristic selected from the group consisting of a position of said artifact-reducing gradients, an amplitude of said artifact-reducing gradients, and a polarity of said artifact-reducing gradients, dependent on said magnetic diffusion gradients to reduce artifacts in said diffusion-weighted image due to additional signal echoes produced by said artifact-reducing gradients.

* * * * *